(12) United States Patent
Han et al.

(10) Patent No.: US 8,928,054 B2
(45) Date of Patent: Jan. 6, 2015

(54) TOUCH SUBSTRATE AND METHOD OF MANUFACTURING THE SAME

(75) Inventors: Sang-Youn Han, Seoul (KR); Mi-Seon Seo, Seoul (KR); Sung-Hoon Yang, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 69 days.

(21) Appl. No.: 13/416,514

(22) Filed: Mar. 9, 2012

(65) Prior Publication Data

US 2013/0048989 A1     Feb. 28, 2013

(30) Foreign Application Priority Data

Aug. 29, 2011   (KR) .................. 10-2011-0086241

(51) Int. Cl.
*H01L 31/062*      (2012.01)
(52) U.S. Cl.
USPC .................................. 257/292; 257/E33.076

(58) Field of Classification Search
USPC .......................................... 257/292, E33.076
See application file for complete search history.

(56) References Cited

U.S. PATENT DOCUMENTS

| 5,235,195 A | * | 8/1993 | Tran et al. ................. 257/59 |
| 2010/0171120 A1 | | 7/2010 | Gosain et al. |

FOREIGN PATENT DOCUMENTS

| JP | 2009-276710 | 11/2009 |
| JP | 2011-039125 | 2/2011 |

* cited by examiner

*Primary Examiner* — Amar Movva
(74) *Attorney, Agent, or Firm* — F. Chau & Associates, LLC

(57) ABSTRACT

A touch substrate includes a base substrate, a sensing element and a switching element. The sensing element is disposed over the base substrate, senses infrared light, and includes a sensing semiconductor pattern. The switching element is electrically connected to the sensing element, includes a material substantially the same as a material of the sensing semiconductor pattern, and includes a switching semiconductor pattern having a thickness different from a thickness of the sensing semiconductor pattern.

8 Claims, 11 Drawing Sheets

TOUCH SUBSTRATE AND METHOD OF MANUFACTURING THE SAME

CROSS-REFERENCE TO RELATED APPLICATION

This application claims priority under 35 U.S.C. §119 to Korean Patent Application No. 2011-86241, filed on Aug. 29, 2011 in the Korean Intellectual Property Office (KIPO), the contents of which are herein incorporated by reference in its entirety.

TECHNICAL FIELD

Example embodiments of the present invention relate to a touch substrate and a method of manufacturing the touch substrate. More particularly, example embodiments of the present invention relate to a touch substrate including a photo sensor sensing an infrared light and a method of manufacturing the touch substrate.

DISCUSSION OF THE RELATED ART

A display device may sense an infrared light and detect a touched position. The display device includes a display panel including a touch substrate, a backlight assembly providing the infrared light to the display panel, and a driving part electrically connected to the display panel and the backlight assembly and detecting the touched position.

The touch substrate includes a light sensor sensing the infrared light, and the light sensor includes a switching element and a sensing element. When a touch is applied to the touch substrate by a certain object, the object reflects the infrared light provided from the backlight assembly, and the sensing element absorbs the reflected infrared light to generate photo current. The photo current is provided to the driving part via the switching element, and the driving part detects the touched position.

The sensing element includes a channel layer having amorphous silicon germanium (a-SiGe), which is capable of absorbing the light in the infrared wavelength range in order to sense the infrared light and then convert the light into the photo current. The switching element includes a channel layer having amorphous silicon (a-Si) having high mobility in order to facilitate providing the photo current from the sensing element to the driving part. The photocurrent is provided to the driving part via a switching source electrode and a switching drain electrode.

The channel layer of the sensing element has a material different from the channel layer of the switching element, so that a first mask for the channel layer of the sensing element and a second mask for the channel layer of the switching element are used. Thus, the manufacturing cost may increase.

SUMMARY OF THE INVENTION

Example embodiments of the present invention provide a touch substrate capable of reducing a manufacturing cost, and a method of manufacturing the touch substrate.

According to an example embodiment of the present invention, a touch substrate includes a base substrate, a sensing element and a switching element. The sensing element is disposed over the base substrate, senses infrared light, and includes a sensing semiconductor pattern. The switching element is electrically connected to the sensing element, includes a material substantially the same as a material of the sensing semiconductor pattern, and includes a switching semiconductor pattern having a thickness different from a thickness of the sensing semiconductor pattern.

In an example embodiment, the sensing semiconductor pattern may include a first sensing semiconductor pattern and a second sensing semiconductor pattern disposed on the first sensing semiconductor pattern. The switching semiconductor pattern may include a first switching semiconductor pattern including a material substantially the same as a material of the first sensing semiconductor pattern and a second switching semiconductor pattern including a material substantially the same as a material of the second sensing semiconductor pattern, and disposed on the first switching semiconductor pattern.

In an example embodiment, the first sensing semiconductor pattern may include amorphous silicon (a-Si), and a second sensing semiconductor pattern may include amorphous silicon germanium (a-SiGe).

In an example embodiment, the second sensing semiconductor pattern may have a first thickness, and the second switching semiconductor pattern may have a second thickness smaller than the first thickness.

In an example embodiment, the first thickness may be substantially the same as or more than about 4000 Å, and the second thickness may be in a range between about 500 Å and about 1500 Å.

In an example embodiment, the second switching semiconductor pattern may include a first semiconductor portion having a first thickness and a second semiconductor portion having a second thickness smaller than the first thickness.

In an example embodiment, the switching element may further include a switching gate electrode, a switching source electrode and a switching drain electrode. The switching gate electrode may overlap with the first and second switching semiconductor patterns. The switching source electrode and a switching drain electrode may be spaced apart from each other, and disposed over the first and second switching semiconductor patterns. The first semiconductor portion may overlap with a space between the switching source electrode and the switching drain electrode. The second semiconductor portion may overlap with the switching source electrode and the switching drain electrode.

In an example embodiment, the switching element may further include a switching ohmic contact pattern disposed between the second switching semiconductor pattern and each of the switching source and drain electrodes.

In an example embodiment, the sensing element may further include a sensing gate electrode overlapping with the first and second sensing semiconductor patterns and a sensing source electrode and a sensing drain electrode spaced apart from each other, and disposed over the first and second sensing semiconductor patterns.

According to an example embodiment of the present invention, a method of manufacturing a touch substrate is provided. In the method, a sensing semiconductor pattern and a switching semiconductor pattern are formed on a base substrate on which a sensing gate electrode and a switching gate electrode are formed, the switching semiconductor pattern including a material substantially the same as a material of the sensing semiconductor pattern and having a thickness different from a thickness of the sensing semiconductor pattern. A sensing source electrode and a sensing drain electrode may be formed on the sensing semiconductor pattern and a switching source electrode and a switching drain electrode are formed on the switching semiconductor pattern to form a sensing element and a switching element.

In an example embodiment, a first sensing semiconductor pattern and a first switching semiconductor pattern may be formed on the base substrate on which the sensing gate electrode and the switching gate electrode are formed, the first switching semiconductor pattern including a material substantially the same as a material of the first sensing semiconductor pattern. A second sensing semiconductor pattern may be formed on the first sensing semiconductor pattern, and a second switching semiconductor pattern including a material substantially the same as a material of the second sensing semiconductor pattern may be formed on the first switching semiconductor pattern.

In an example embodiment, when the sensing semiconductor pattern and the switching semiconductor pattern are formed, a first semiconductor layer, a second semiconductor layer and a photoresist layer may be sequentially formed on the base substrate on which the sensing gate electrode and the switching gate electrode are formed. The photoresist layer may be patterned using a mask, and a first photo pattern having a first thickness may be formed over the sensing gate electrode and a second photo pattern having a second thickness smaller than the first thickness may be formed over the switching gate electrode. The first and second sensing semiconductor patterns may be formed using the first photo pattern as an etch mask, and the first and second switching semiconductor patterns may be formed using the second photo pattern as an etch mask.

In an example embodiment, the first semiconductor layer may include amorphous silicon (a-Si), and the he second semiconductor layer may include amorphous silicon germanium (a-SiGe).

In an example embodiment, the second sensing semiconductor pattern may have a third thickness, and the second switching semiconductor pattern may have a fourth thickness smaller than the third thickness.

In an example embodiment, in the method, ohmic contact patterns may be formed on each of the second sensing semiconductor pattern and the second semiconductor pattern.

In an example embodiment, the second photo pattern may overlap with each of the switching source electrode and the switching drain electrode.

In an example embodiment, when the first and second photo patterns are formed, the second photo pattern having the first thickness may be formed over the switching gate electrode. The second photo pattern may overlap with a space between the switching source electrode and the switching drain electrode.

In an example embodiment, when the first and second sensing semiconductor patterns and the first and second switching semiconductor patterns are formed, the second sensing semiconductor pattern having a third thickness may be formed. A first semiconductor portion having a fourth thickness smaller than the third thickness may be formed between the switching gate electrode and each of the switching source and drain electrodes and a second semiconductor portion having the third thickness may be formed between the switching gate electrode and in a space between the switching source electrode and the switching drain electrode.

A method of forming a touch substrate, according to an embodiment of the present invention, comprises sequentially forming a first semiconductor layer, a second semiconductor layer and a photoresist layer on a base substrate, patterning the photoresist layer to form a first photo pattern having a first thickness in sensing region and to form a second photo pattern having a second thickness smaller than the first thickness in a switching region, and simultaneously forming a sensing semiconductor pattern using the first photo pattern as an etch mask, and a switching semiconductor pattern using the second photo pattern as an etch mask.

In an embodiment, the sensing semiconductor pattern may include a first sensing semiconductor pattern and a second sensing semiconductor pattern formed on the first sensing semiconductor pattern, and the switching semiconductor pattern may include a first switching semiconductor pattern and a second switching semiconductor pattern formed on the first switching semiconductor pattern, wherein a thickness of the second switching semiconductor pattern is smaller than a thickness of the second sensing semiconductor pattern.

According to a touch substrate and a method of manufacturing the touch substrate of embodiments of the present invention, first and second switching semiconductor patterns of a switching element and first and second sensing semiconductor patterns of a sensing element are simultaneously formed using a mask, so that a manufacturing cost may be reduced.

In addition, a thickness of a second switching semiconductor pattern of the switching element is smaller than a thickness of a second sensing semiconductor pattern of the sensing element, so that the mobility of the switching element may be improved.

In addition, a thickness of each of first semiconductor portions between each of a switching source and drain electrodes and a first switching semiconductor pattern is smaller than a thickness of a second semiconductor portion overlapping with a space between the source electrode and the drain electrode, so that the mobility of the switching element may be improved.

BRIEF DESCRIPTION OF THE DRAWINGS

The embodiments of the present invention will become more apparent by describing in detailed example embodiments of the present invention with reference to the accompanying drawings, in which.

DETAILED DESCRIPTION OF EMBODIMENTS OF THE INVENTION

Hereinafter, embodiments of the present invention will be explained in detail with reference to the accompanying drawings. However, the present invention may be embodied in various different ways and should not be construed as limited to the exemplary embodiments described herein.

It will be understood that when an element or layer is referred to as being "on," "connected to" or "coupled to" another element or layer, it can be directly on, connected or coupled to the other element or layer or intervening elements or layers may be present. Like numbers may refer to like elements throughout the specification and drawings.

As used herein, the singular forms, "a," "an" and "the" are intended to include the plural forms as well, unless the context clearly indicates otherwise.

Figure 1:
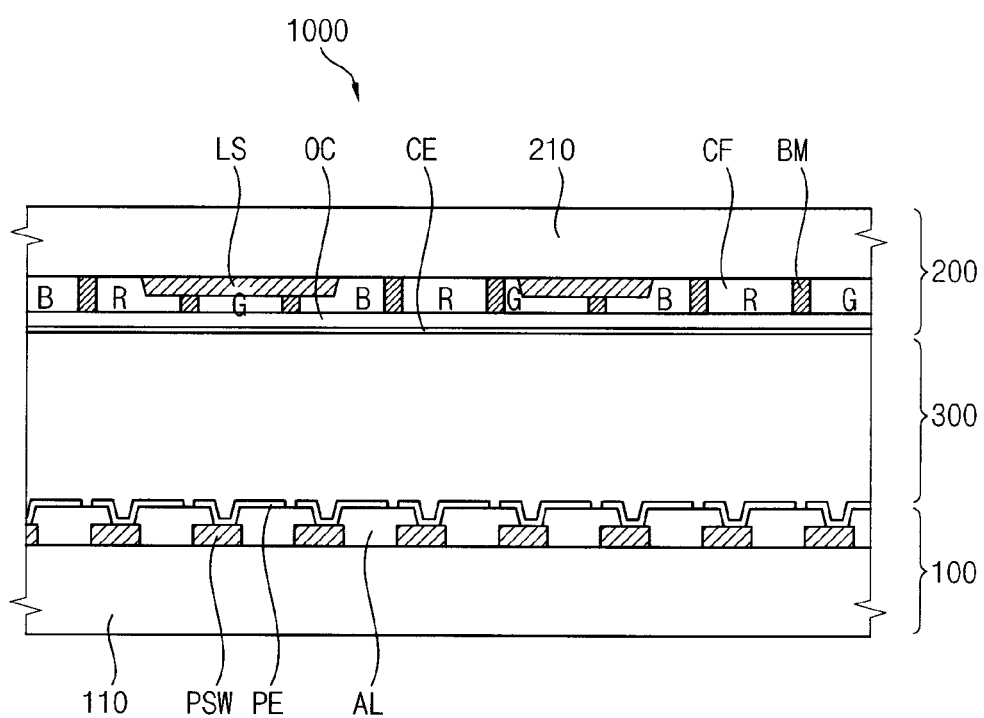
FIG. 1 is a cross-sectional view illustrating a display panel including a touch substrate according to an example embodiment of the present invention.

FIG. 1 is a cross-sectional view illustrating a display panel including a touch substrate according to an example embodiment of the present invention.

Referring to FIG. 1, a display panel 1000 according to an example embodiment includes an array substrate 100, a touch substrate 200 positioned opposite to the array substrate 100 and a liquid crystal layer 300 disposed between the array substrate 100 and the touch substrate 200.

The array substrate 100 includes a first base substrate 110, a pixel switching element PSW, a pixel electrode PE and an array layer AL. The pixel switching element PSW is formed on the first base substrate 110, and the pixel electrode PE is electrically connected to the pixel switching element PSW. The pixel electrode PE can define a unit pixel of the array substrate 100.

The touch substrate 200 includes a base substrate 210 and a light sensor LS. According to an embodiment, the touch substrate 200 further includes a light blocking pattern BM, a color filter CF, an over-coating layer OC and a common electrode CE. The light sensor LS is disposed on the second base substrate 210. The light sensor LS can correspond to three unit pixels. The light sensor LS senses infrared light. The common electrode CE faces the pixel electrode PE, and forms an electrical field with the pixel electrode PE in the liquid crystal layer 300.

Figure 2:
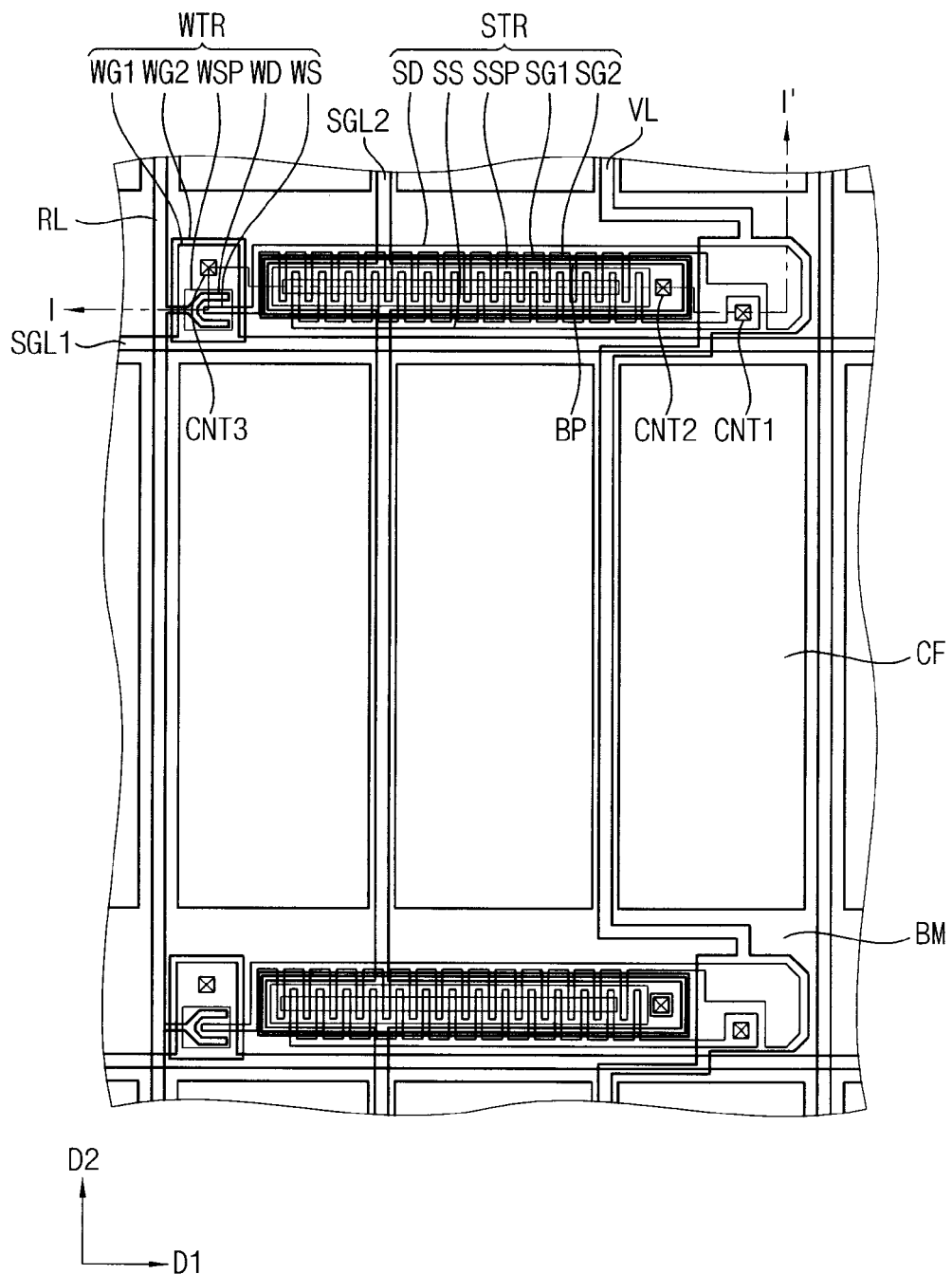
FIG. 2 is a plan view illustrating a touch substrate of FIG. 1.

FIG. 2 is a plan view illustrating a touch substrate of FIG. 1.

Referring to FIGS. 1 and 2, the touch substrate 200 includes a light sensor LS, a first sensing gate line SGL1, a second sensing gate line SGL2, a read-out line RL, a bias line VL, a band pass pattern BP, a capacitor Cst (see FIG. 3A), a light blocking pattern BM, a color filter CF and a common electrode CE. The light sensor LS includes a switching element WTR and a sensing element STR.

The first sensing gate line SGL1 extends in a first direction D1, and applies a first sensing gate signal. The second sensing gate line SGL2 extends in a second direction D2 different from the first direction D1, and applies a second sensing gate signal. According to an embodiment, the first direction D1 is substantially perpendicular to the second direction D2.

The read-out line RL extends in the second direction D2. The read-out line RL can be disposed adjacent to the second sensing gate line SGL2. The read-out line RL outputs an infrared sensing signal outputted from the sensing element STR to a driving part connected to the display panel 1000.

The bias line VL extends in the second direction D2, and carries a source bias. The bias line VL can be disposed adjacent to the second sensing gate line SGL2.

The second sensing gate line SGL2 can be disposed between the first read-out line RL and the bias line VL.

Figure 3A:
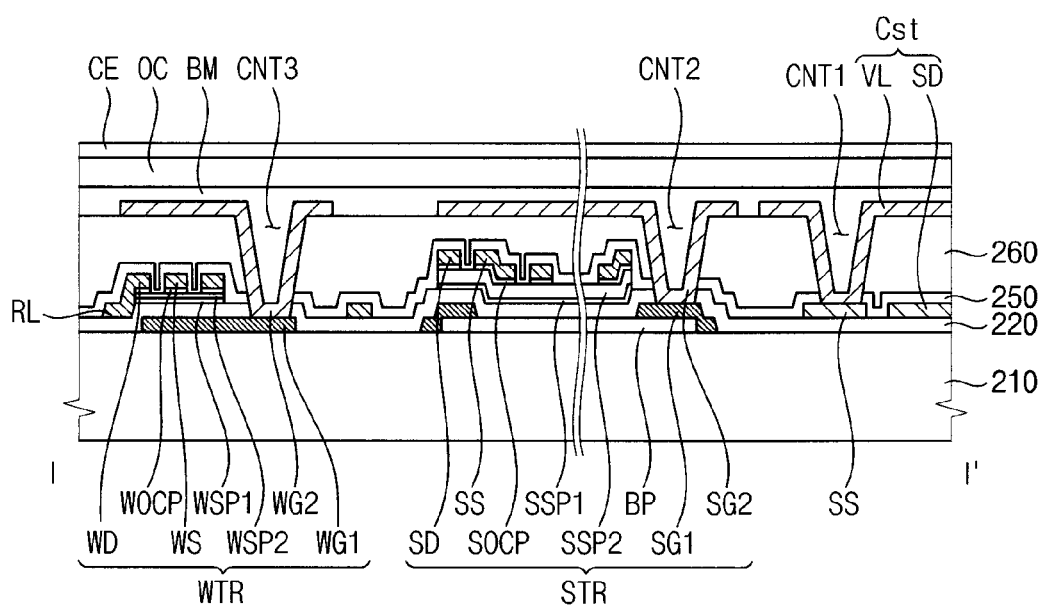
FIG. 3A is a cross-sectional view taken along a line I-I' of FIG. 2.
Figure 3B:
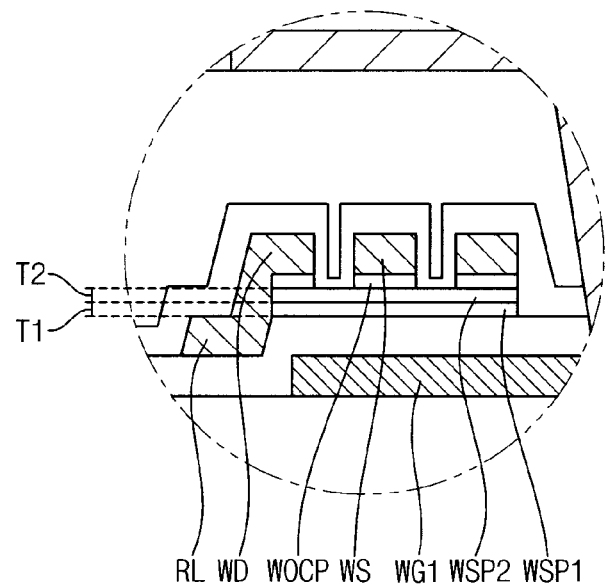
FIG. 3B is an exploded view illustrating a switching element of FIG. 3A.
Figure 3C:
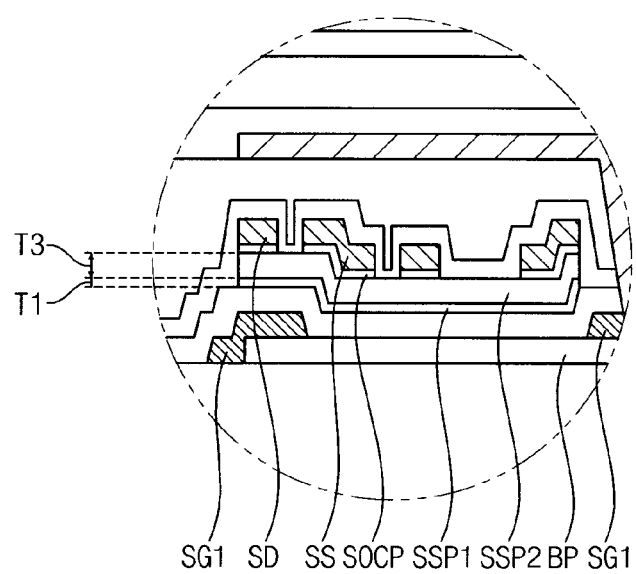
FIG. 3C is an exploded view illustrating a sensing element of FIG. 3A.

FIG. 3A is a cross-sectional view taken along a line I-I' of FIG. 2. FIG. 3B is an exploded view illustrating a switching element of FIG. 3A. FIG. 3C is an exploded view illustrating a sensing element of FIG. 3A.

Referring to FIGS. 2 and 3A, the switching element WTR is connected to the first sensing gate line SGL1 and the read-out line RL.

The switching element WTR includes a first switching gate electrode WG1, a switching drain electrode WD, a switching source electrode WS, a first switching semiconductor pattern WSP1 and a second switching semiconductor pattern WSP2. The switching element WTR can further include a second switching gate electrode WG2 and a switching ohmic contact pattern WOCP.

The first switching gate electrode WG1 is disposed on the second base substrate 210, and connected to the first sensing gate line SGL1. The switching drain electrode WD is connected to the read-out line RL. The switching source electrode WS is spaced apart from the switching drain electrode WD, and connected to the sensing element STR.

The first switching semiconductor pattern WSP1 and the second switching semiconductor pattern WSP2 are disposed over the first switching gate electrode WG1, and overlap with the first switching gate electrode WG1. In addition, the first switching semiconductor pattern WSP1 and the second switching semiconductor pattern WSP2 overlap with each of the switching drain electrode WD and the switching source electrode WS. The switching drain and source electrodes WD, WS are disposed over the second switching semiconductor pattern WSP2, and the second switching semiconductor pattern WSP2 is disposed on the first switching semiconductor pattern WSP1.

According to an embodiment, referring to FIG. 3B, the first switching semiconductor pattern WSP1 has a first thickness T1 substantially same as or less than about 500 Å. The second switching semiconductor pattern WSP2 has a second thickness T2 substantially same as or less than about 1500 Å.

When the second switching semiconductor pattern WSP2 is entirely removed, the mobility of the switching element WTR may increase, but an off current may also increase. According to an embodiment, the second switching semiconductor pattern WSP2 can have a second thickness T2 in a range between about 500 Å and about 1500 Å. As the second thickness of the second switching semiconductor pattern WSP2 decreases, the mobility of the switching element WTR increases. For example, when the second switching semiconductor pattern WSP2 has a thickness of about 500 Å, the mobility of the switching element WTR is about 0.5 $cm^2$/Vs, and when the second switching semiconductor pattern WSP2 has a thickness of about 1500 Å, the mobility of the switching element WTR is about 0.4 $cm^2$/Vs.

Referring to FIG. 2 and FIG. 3A, a first sensing gate signal applied through the first sensing gate line SGL1 is applied to the first switching gate electrode WG1.

The second switching gate electrode WG2 is disposed over the switching source electrode WS and the switching drain electrode WD. According to an embodiment, the second switching gate electrode WG2 is connected to the first switching gate electrode WG1 through a third contact hole CNT3. According to an embodiment, the second switching gate electrode WG2 may be omitted.

The switching ohmic contact pattern WOCP is disposed between the second switching semiconductor pattern WSP2 and each of the switching source electrode WS and the switching drain electrode WD. According to an embodiment, the switching ohmic contact pattern WOCP includes n+ amorphous silicon (n+ a-Si).

The sensing element STR senses the infrared light. The sensing element STR is connected to the second sensing gate line SGL2, the bias line VL and a switching element WTR.

The sensing element STR includes a first sensing gate electrode SG1, a sensing source electrode SS, a sensing drain electrode SD, a first sensing semiconductor pattern SSP1 and a second sensing semiconductor pattern SSP2. The sensing element STR can further include a second sensing gate electrode SG2 and a sensing ohmic contact pattern SOCP.

The first sensing gate electrode SG1 is disposed on the band pass filter BP, and connected to the band pass filter BP. The first sensing gate electrode SG1 is connected to the second sensing gate line SGL2. The sensing source electrode SS is connected to the bias line VL through a first contact hole CNT1. The sensing drain electrode SD is spaced apart from the sensing source electrode SS, and is connected to the switching element WTR.

According to an embodiment, the sensing source electrode SS and the sensing drain electrode SD have a concavo-convex structure having regular U-shape patterns, which creates a relatively wide channel area of the sensing element STR.

The first sensing semiconductor pattern SSP1 and the second sensing semiconductor pattern SSP2 are disposed over the band pass filter BP and the first sensing gate electrode SG1, and overlap with the band pass filter BP and the first sensing gate electrode SG1. In addition, the first sensing semiconductor pattern SSP1 and the second sensing semiconductor pattern SSP2 overlap with each of the sensing drain electrode SD and the sensing source electrode SS. The sensing drain and source electrodes are disposed over the second sensing semiconductor pattern SSP2, and the second sensing semiconductor pattern SSP2 is disposed on the first sensing semiconductor pattern SSP1.

Referring to FIG. 3C, according to an embodiment of the present invention, the first sensing semiconductor pattern SSP1 has the first thickness T1 substantially the same as or less than about 500 Å. The second sensing semiconductor pattern SSP2 has a third thickness T3 substantially the same as or more than about 4000 Å to sufficiently absorb the infrared light.

Referring to FIG. 2 and FIG. 3A, the sensing element STR is connected to the band pass filter BP. The second sensing gate signal applied through the second sensing gate line SGL2 is applied to the first sensing gate electrode SG1. In addition, according to an embodiment, the second sensing gate signal can be applied to the band pass filter BP through the first sensing gate electrode SG1. Alternatively, the band pass filter BP can be connected to a separate signal line.

According to an embodiment, the second sensing gate electrode SG2 is disposed over the sensing drain electrode SD and the sensing source electrode SS. The second sensing gate electrode SG2 is connected to the first sensing gate electrode SG1 through a second contact hole CNT2. According to an embodiment, the second sensing gate electrode SG2 can be omitted.

According to an embodiment, the sensing ohmic contact pattern SOCP can be disposed between the second sensing semiconductor pattern SSP2 and each of the sensing drain electrode SD and the sensing source electrode SS. The sensing ohmic contact pattern SOCP includes n+ amorphous silicon (n+ a-Si).

According to an embodiment, when the touch substrate 200 omits the second switching gate electrode WG2 and the second sensing gate electrode SG2, the bias line VL can be simultaneously formed with the first switching gate electrode WG1.

The band pass filter BP is disposed under the sensing element STR, so that the band pass filter BP transmits the infrared light and blocks light except for the infrared light.

The capacitor Cst includes the sensing drain electrode SD as a first electrode, the bias line VL as a second electrode facing the first electrode, and the second and third insulating layers 250 and 260 disposed between the first electrode and the second electrode. The capacitor Cst charges a voltage generated by the infrared light incident into the second sensing semiconductor pattern SSP2 of the sensing element STR.

According to an embodiment, the light blocking pattern BM is formed over the switching element WTR, the sensing element STR, the read-out line RL, the first and second sensing gate lines SGL1 and SGL2 and the bias line VL.

Referring to FIG. 1, the color filter CF is formed in an area in which the light blocking pattern BM is not formed. The color filter CF faces the pixel electrode PE of the first array substrate 100.

According to an embodiment, the touch substrate 200 further includes the over-coating layer OC. The over-coating layer OC can be disposed on the light blocking pattern BM and the color filter CF.

The common electrode CE is disposed on the over-coating layer OC. According to an embodiment the common electrode CE is formed over the entire touch substrate 200.

A process of sensing the infrared light by the switching element WTR and the sensing element STR is explained below.

When the second sensing gate signal is applied to the second sensing gate line SGL2, a source bias is applied to the sensing source electrode SS through the bias line VL in response to the second sensing gate signal.

When the infrared light is irradiated to the second sensing semiconductor pattern SSP2 with the application of the second sensing gate signal, the sensing source electrode SS is electrically connected to the sensing drain electrode SD. The second sensing semiconductor pattern SSP2 is activated and a photo current flows from the sensing drain electrode SD to the sensing source electrode SS, so that the capacitor Cst is charged by the photo current.

The charge of the capacitor Cst is outputted via the switching element WTR turned on in response to the first sensing gate signal and via the read-out line RL. The resulting output signal is provided to the driving part, so that the driving part can detect a touched position on the touch substrate 200 based on the output signal.

According to an example embodiment, the light sensor LS includes the sensing element STR sensing the infrared light, and further includes a sensing element sensing visible light. The sensing element sensing the visible light can have a structure substantially the same as that of the switching element WTR.

FIGS. 4A to 4G are cross-sectional views illustrating a method of manufacturing the touch substrate of FIG. 1.

Figure 4A:
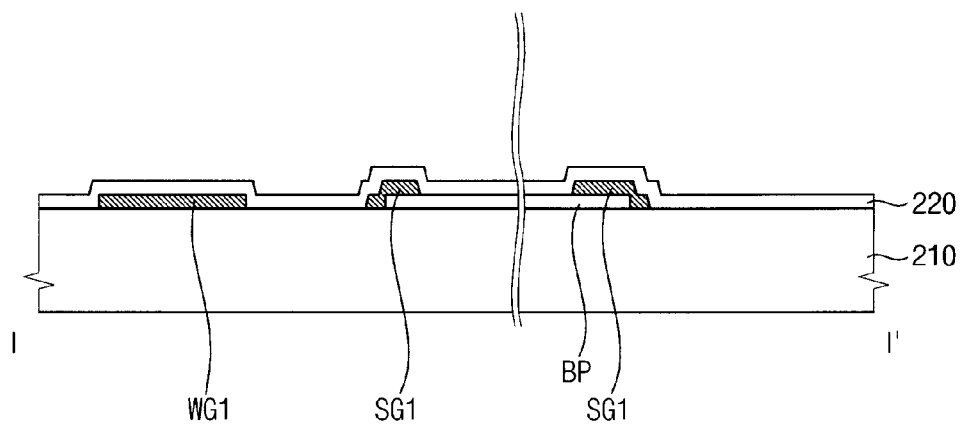
FIGS. 4A to 4G are cross-sectional views illustrating a method of manufacturing the touch substrate of FIG. 1, according to an example embodiment of the present invention.

Referring to FIG. 4A, the band pass pattern BP is formed on the second base substrate 210. For example, a band pass layer is formed on the second base substrate 210 and the band pass layer is patterned, so that the band pass pattern BP can be formed.

A first metal pattern including the first switching gate electrode WG1 and the first sensing gate electrode SG1 is formed on the second base substrate 210 on which the band pass pattern BP is formed. A first metal layer is formed on the second base substrate on which the band pass pattern BP is formed and the first metal layer is patterned, so that the first metal pattern can be formed. The first sensing gate electrode SG1 is formed on the band pass pattern BP.

According to an embodiment, the first metal pattern further includes the first and second sensing gate lines SGL1 and SGL2.

The first insulating layer 220 is formed on the second base substrate 210 on which the band pass pattern BP and the first metal pattern are formed.

Figure 4B:
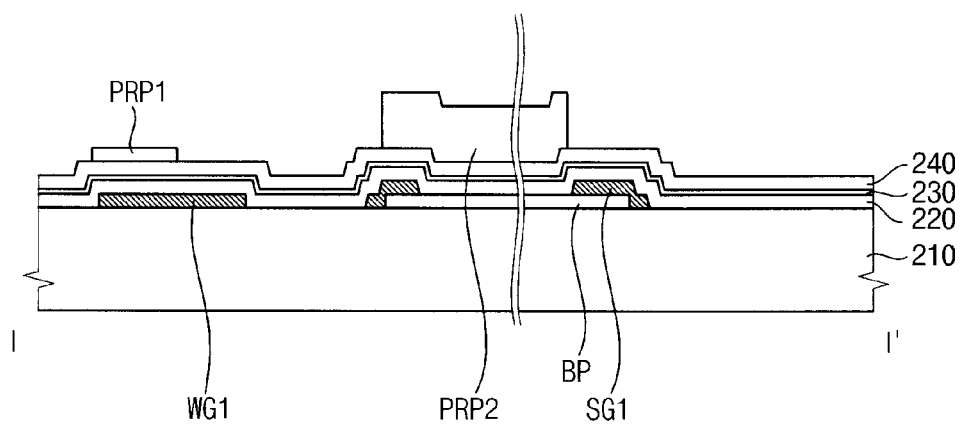
Figure 4C:
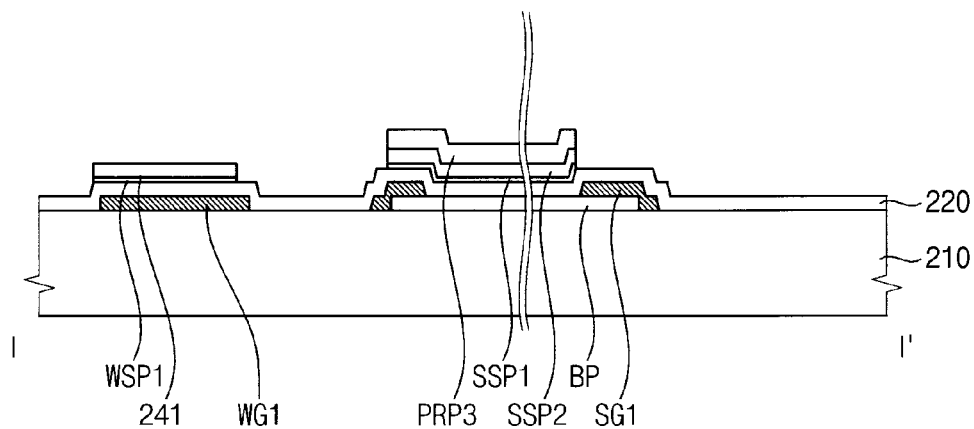
Figure 4D:
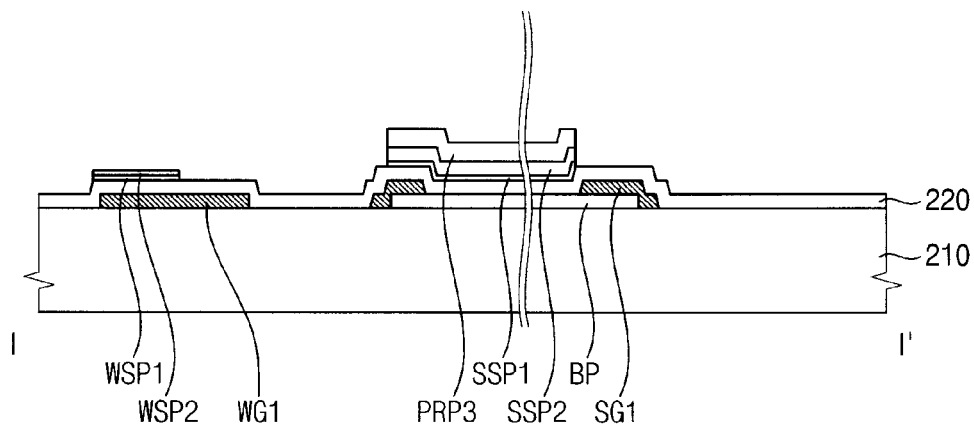

Referring to FIGS. 4B-4D, the first switching semiconductor pattern WSP1, the first sensing semiconductor pattern SSP1, the second switching semiconductor pattern WSP2 and the second sensing semiconductor pattern SSP2 are formed on the second base substrate 210 on which the first insulating layer 220 is formed.

For example, referring to FIG. 4B, a first semiconductor layer 230 and a second semiconductor layer 240 are sequentially formed on the second base substrate 210 on which the first insulating layer 220 is formed. A photoresist layer is formed on the second base substrate 210 on which the first semiconductor layer 230 and the second semiconductor layer 240 are formed, and the photoresist layer is patterned using a slit mask or a half-tone mask, so that a first photoresist pattern PRP1 and a second photoresist pattern PRP2 are formed.

The first semiconductor layer 230 includes amorphous silicon (a-Si), and the second semiconductor layer 240 includes amorphous silicon germanium (a-SiGe). The first semiconductor layer 230 is formed with the first thickness T1 substantially the same as or less than about 500 Å. The second semiconductor layer 240 is formed with the third thickness T3 substantially the same as or more than about 4000 Å in order to sufficiently absorb the infrared light.

The first photoresist pattern PRP1 is formed with a fourth thickness over the first switching gate electrode WG1, and the second photoresist pattern PRP2 is formed with a fifth thickness larger than the fourth thickness over the first sensing gate electrode SG1.

Referring to FIG. 4C, the first and second semiconductor layers 230 and 240 are patterned using the first and second photoresist patterns PRP1 and PRP2 as etch-masks, so that the first switching semiconductor pattern WSP1, the first sensing semiconductor pattern SSP1, the second sensing semiconductor pattern SSP2 and a second semiconductor pattern 241 are formed.

The first and second photoresist patterns PRP1 and PRP2 are ashed, so that the first photoresist pattern PRP1 and part of the second photoresist pattern PRP2 are removed and a third photoresist pattern PRP3 is formed over the first sensing gate electrode SG1.

Referring to FIG. 4D, exposed second semiconductor pattern 241 is etched, so that the second switching semiconductor pattern WSP2 is formed with the second thickness T2 and the second sensing semiconductor pattern SSP2, covered by the third photoresist pattern PRP3, remains.

According to an embodiment, a second thickness T2 of the second switching semiconductor pattern WSP2 is in a range between about 500 Å and about 1500 Å. As the second thickness T2 of the second switching semiconductor pattern WSP2 decreases, resistances of the first switching semiconductor pattern WSP1, the switching source electrode WS and the switching drain electrode WD decrease. Thus, the mobility of the switching element WTR may increase.

Alternatively, the exposed second semiconductor pattern 241 is entirely etched, so that the first switching semiconductor pattern WSP1 is exposed and the second sensing semiconductor pattern SSP2 covered by the third photoresist pattern PRP3 remains. Thus, the mobility of the switching element WTR may increase, but an off current may increase.

Figure 4E:
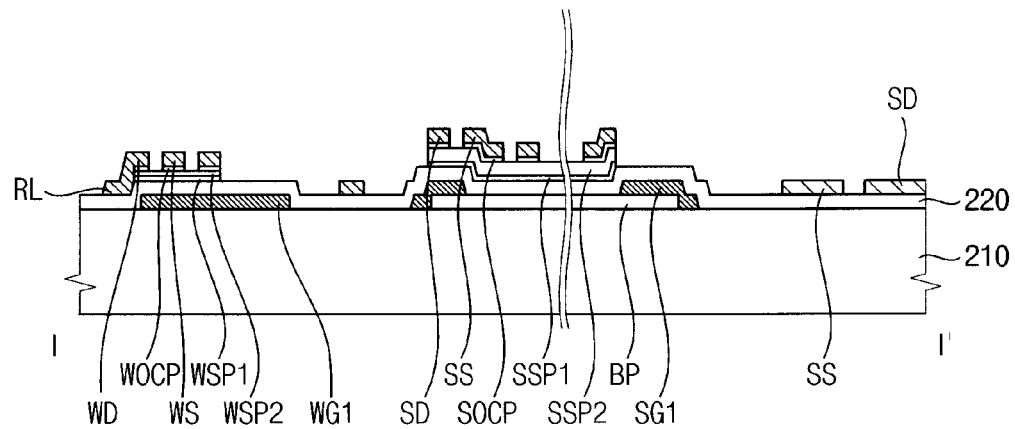

Referring to FIG. 4E, the switching ohmic contact pattern WOCP and the sensing ohmic contact pattern SOCP are formed on the second base substrate 210 on which the first and second switching semiconductor patterns WSP1 and WSP2 and the first and second sensing semiconductor patterns SSP1 and SSP2 are formed. For example, an ohmic contact layer is formed on the second base substrate 210 on which the first and second switching semiconductor patterns WSP1 and WSP2 and the first and second sensing semiconductor patterns SSP1 and SSP2 are formed, and then the ohmic contact layer is patterned, so that the switching ohmic contact pattern WOCP and the sensing ohmic contact pattern SOCP can be formed.

The switching ohmic contact pattern WOCP is formed on the second switching semiconductor pattern WSP2, and the sensing ohmic contact pattern SOCP is formed on the second sensing semiconductor pattern SSP2.

A second metal pattern is formed on the second base substrate 210 on which the switching ohmic contact pattern WOCP and the sensing ohmic contact pattern SOCP are formed. The second metal pattern includes the switching source electrode WS, the switching drain electrode WD, the sensing source electrode SS and the sensing drain electrode SD. For example, a second metal layer is formed on the second base substrate 210 on which the switching ohmic contact pattern WOCP and the sensing ohmic contact pattern SOCP are formed, and then the second metal layer is patterned, so that the second metal pattern can be formed. According to an embodiment, the second metal pattern further includes the read-out line RL.

The switching source electrode WS and the switching drain electrode WD are spaced from each other, and the sensing source electrode SS and the sensing drain electrode SD are spaced apart from each other. The portion of the switching ohmic contact pattern WOCP exposed through spaces between the switching source electrode WS and the switching drain electrode WD is etched, so that the second switching semiconductor pattern WSP2 in the spaces is exposed. The portion of the sensing ohmic contact pattern SOCP exposed through a space between the sensing source electrode SS and the sensing drain electrode SD is etched, so that the second sensing semiconductor pattern SSP2 in the space is exposed.

Alternatively, the ohmic contact layer and the second metal layer are sequentially formed on the second base substrate 210 on which the first and second switching semiconductor patterns WSP1 and WSP2 and the first and second sensing semiconductor patterns SSP1 and SSP2 are formed, and then the ohmic contact layer and the second metal layer are simultaneously patterned, so that the switching ohmic contact pattern WOCP, the sensing ohmic contact pattern SOCP and the second metal pattern can be formed.

Figure 4F:
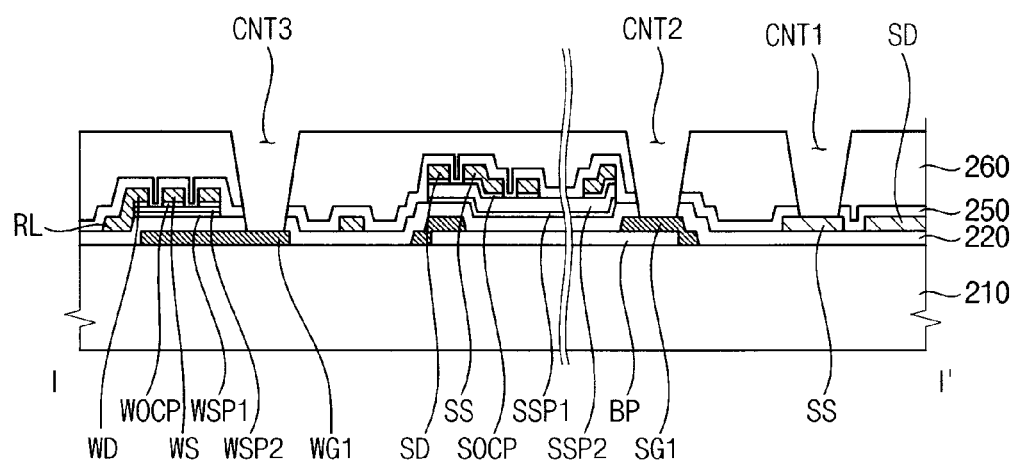

Referring to FIG. 4F, the second and third insulating layers 250 and 260 are formed on the second base substrate 210 including the second metal pattern. The second and third insulating layer 250 and 260 formed on a part of the sensing source electrode SS are removed, so that a first contact hole CNT1 is formed. In addition, the first, second and third insulating layers 220, 250 and 260 formed on part of the first sensing gate electrode SG1 are removed, so that a second contact hole CNT2 is formed, and the first, second and third insulating layers 220, 250 and 260 formed on part of the first switching gate electrode SG1 are removed, so that a third contact hole CNT3 is formed.

Figure 4G:
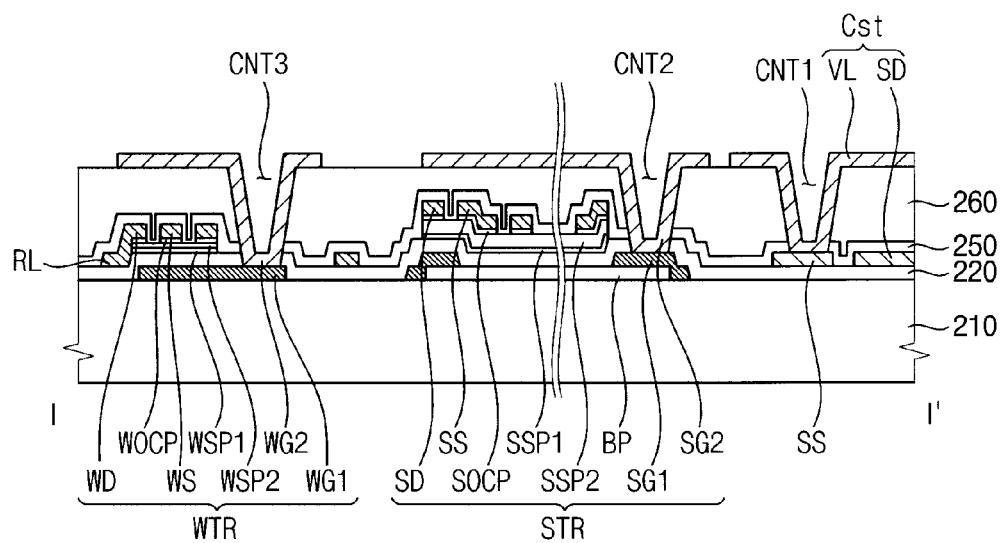

Referring to FIG. 4G, a third metal layer is formed on the second base substrate 210 on which the first, second and third contact holes CNT1, CNT2 and CNT3 are formed, and then the third metal layer is patterned, so that a third metal pattern is formed. The third metal pattern includes the second switching gate electrode WG2, the second sensing gate electrode SG2 and the bias line VL.

Referring to FIGS. 1 and 3, the blocking pattern BM, the color filter CF, the over-coating layer OC and the common electrode CE are formed on the second base substrate 210 on which the third metal pattern is formed.

According to an example embodiment, the first and second semiconductor layers 230 and 240 are simultaneously patterned using one mask, so that a manufacturing cost can be reduced.

In addition, the thickness of the second switching semiconductor pattern WSP2 of the switching element WTR is smaller than the thickness of the second sensing semiconductor pattern SSP2 of the sensing element STR, so that the mobility of the switching element WTR can increase.

Figure 5A:
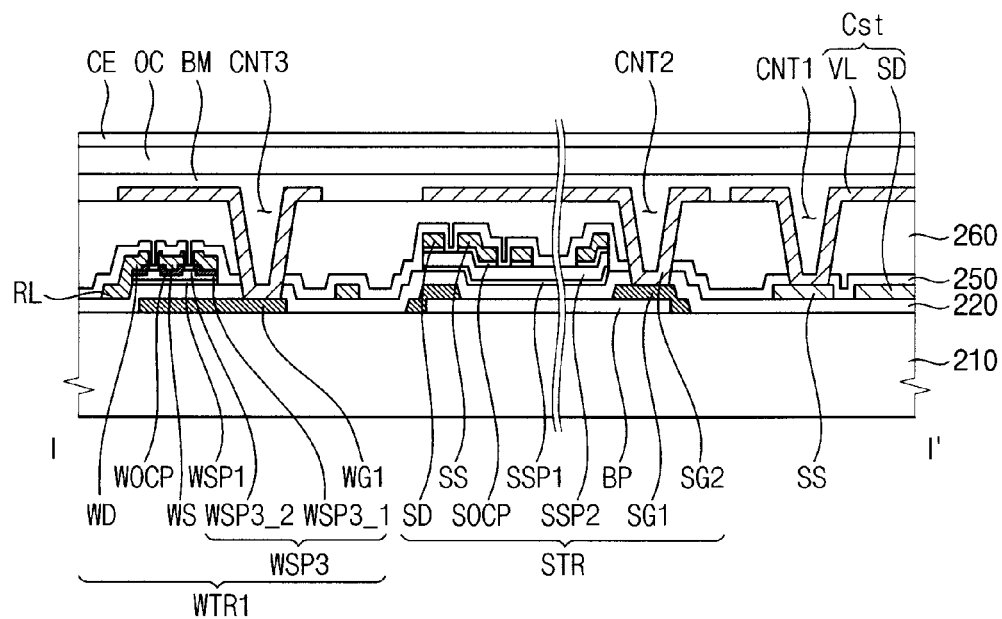
FIG. 5A is a cross-sectional view illustrating a touch substrate according to an example embodiment of the present invention.
Figure 5B:
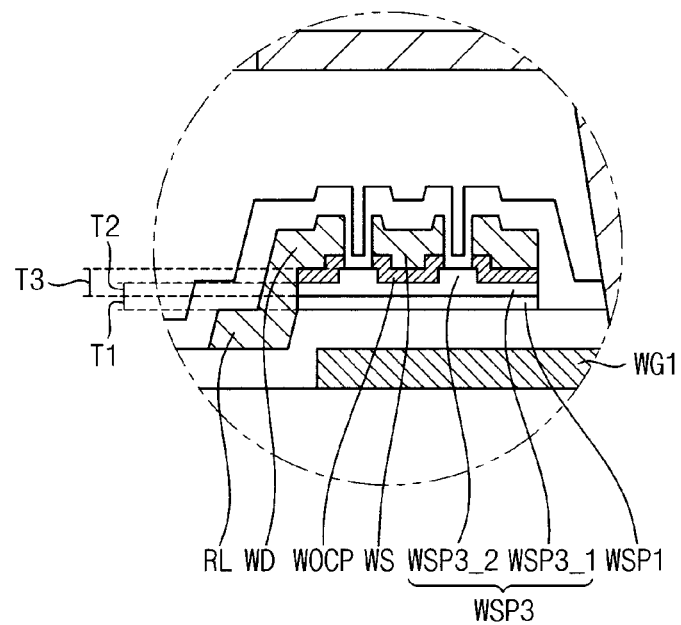
FIG. 5B is an exploded view illustrating a switching element of FIG. 5A.
Figure 5C:
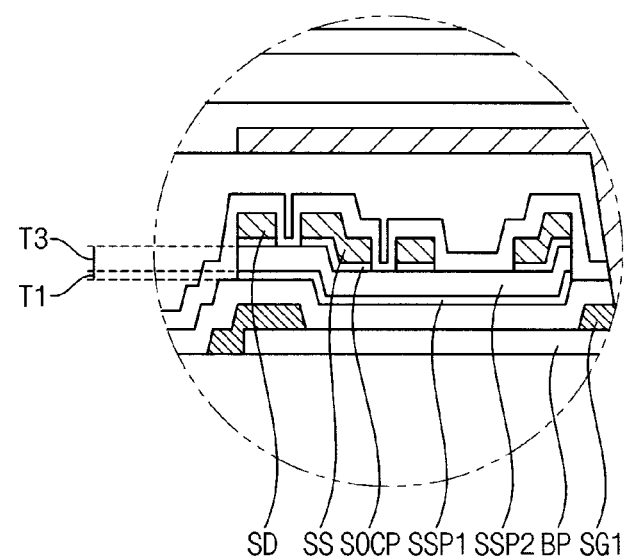
FIG. 5C is an exploded view illustrating a sensing element of FIG. 5A.

FIG. 5A is a cross-sectional view illustrating a touch substrate according to an example embodiment of the present invention. FIG. 5B is an exploded view illustrating a switching element of FIG. 5A.

A touch substrate according to an example embodiment is substantially the same as the touch substrate according to the example embodiment described in connection FIG. 3A except for the second switching semiconductor pattern of the switching element. Thus, the same reference numerals may be used to refer to the same or like parts as those described in the example embodiment in connection with FIG. 3A.

Referring to FIG. 5A, the switching element WTR1 is connected to the first sensing gate line SGL1 and the read-out line RL.

The switching element WTR1 includes a first switching gate electrode WG1, a switching drain electrode WD, a switching source electrode WS, a first switching semiconductor pattern WSP1 and the second switching semiconductor pattern WSP3. According to an embodiment, the switching element WTR1 further includes a second switching gate electrode WG2 and a switching ohmic contact pattern WOCP.

The second switching semiconductor pattern WSP3 is disposed on the first switching semiconductor pattern WSP1. The second switching semiconductor pattern WSP3 includes a first semiconductor portion WSP3_1 and a second semiconductor portion WSP3_2.

The first semiconductor portion WSP3_1 is disposed between the first switching semiconductor pattern WSP1 and each of the switching source electrode WS and the switching drain electrode WD. The second semiconductor portion WSP3_2 overlaps with spaces between the switching source electrode WS and the switching drain electrode WD.

Referring to FIG. 5B, the first switching semiconductor pattern WSP1 has a first thickness T1 substantially the same as or less than about 500 Å. The first semiconductor portion WSP3_1 has a second thickness T2 substantially the same as or less than about 1500 Å. The second semiconductor portion WSP3_2 has a third thickness T3 substantially the same as or more than about 4000 Å, which is larger than the second thickness T2.

When the first semiconductor portion WSP3_1 is entirely removed, separated distances between the first switching semiconductor pattern WSP1 and each of the switching source electrode WS and the switching drain electrode WD decrease, so that resistances between the first switching semiconductor pattern WSP1 and each of the switching source electrode WS and the switching drain electrode WD decrease. Thus, the mobility of the switching element WTR increases, but an off current may increase. According to an embodiment, the second thickness T2 of the first semiconductor portion WSP3_1 decreases, so that the mobility of the switching element WTR may increase. For example, when the second thickness of the first semiconductor portion WSP3_1 is about 500 Å, the mobility of the switching element WTR is about 0.5 $cm^2$/Vs. When the second thickness of the first semiconductor portion WSP3_1 is about 1500 Å, the mobility of the switching element WTR is about 0.4 $cm^2$/Vs.

Referring to FIG. 5A, the first sensing gate signal applied via the first sensing gate line SGL1 is applied to the first switching gate electrode WG1.

FIGS. 6A to 6D are cross-sectional views illustrating a method of manufacturing the touch substrate of FIG. 5A.

Figure 6A:
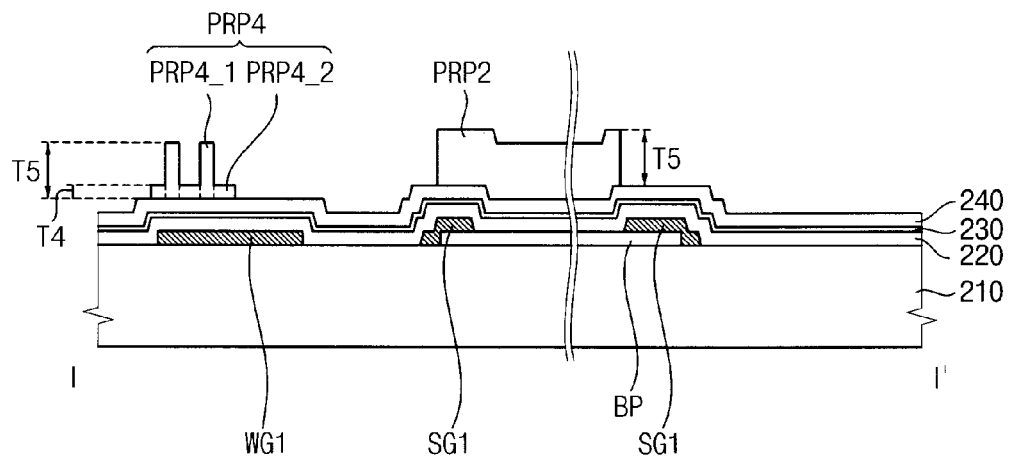
FIGS. 6A to 6D are cross-sectional views illustrating a method of manufacturing the touch substrate of FIG. 5A, according to an embodiment of the present invention.
Figure 6B:
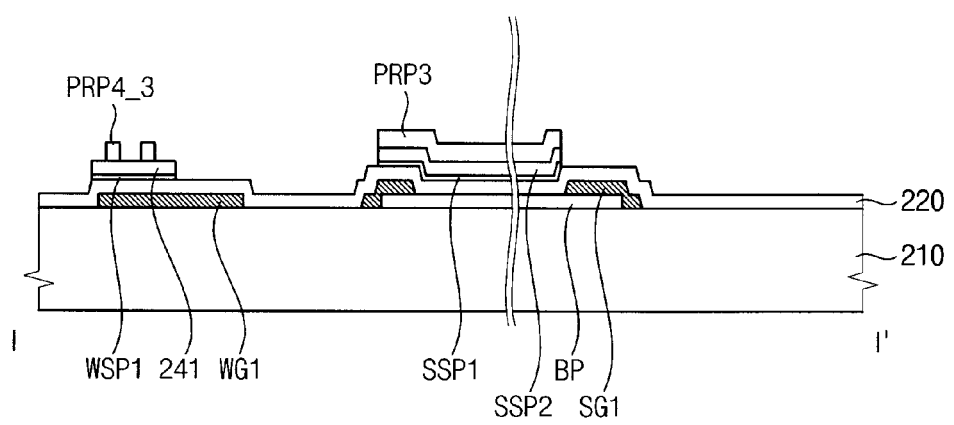
Figure 6C:
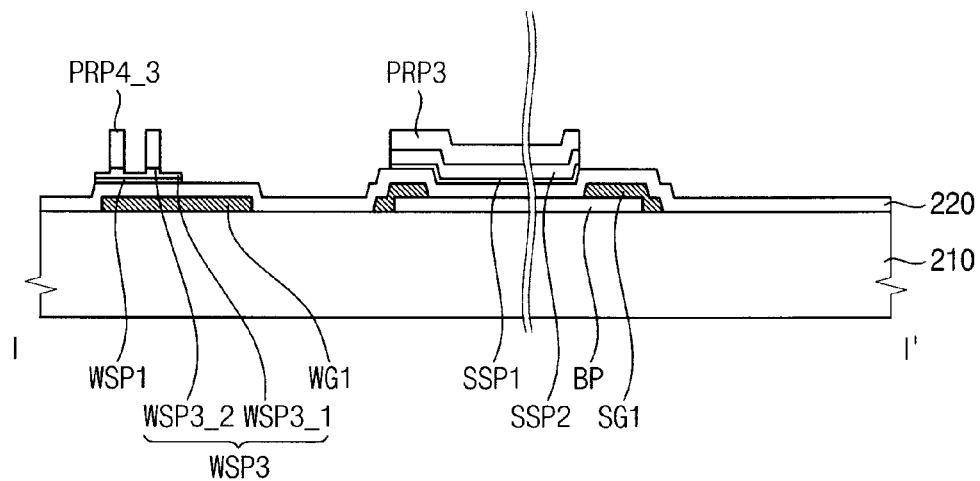

Referring to FIGS. 6A-6C, the first switching semiconductor pattern WSP1, the first sensing semiconductor pattern SSP1, the second switching semiconductor pattern WSP3 and the second sensing semiconductor pattern SSP2 are formed on the second base substrate 210 on which the band pass filter BP, the first switching gate electrode WG1, the first sensing gate electrode SG1 and the first insulating layer 220 are formed.

For example, a first semiconductor layer 230 and a second semiconductor layer 240 are sequentially formed on the second base substrate 210 on which the band pass filter BP, the first switching gate electrode WG1, the first sensing gate electrode SG1 and the first insulating layer 220 are fowled. A photoresist layer is formed on the second base substrate 210 on which the first semiconductor layer 230 and the second semiconductor layer 240 are formed, and then the photoresist layer is exposed and developed using a slit mask or a half-tone mask, so that a first photoresist pattern and PRP4 and a second photoresist pattern PRP2 are formed.

The first semiconductor layer 230 includes amorphous silicon (a-Si), and the second semiconductor layer 240 includes amorphous silicon germanium (a-SiGe). The first semiconductor layer 230 is formed with the first thickness T1 substantially the same as or less than about 500 Å. The second semiconductor layer 240 is formed with the third thickness T3 substantially the same as or more than about 4000 Å in order to sufficiently absorb the infrared light.

The first photoresist pattern PRP4 is formed over the first switching gate electrode WG1, and includes a first sub photoresist pattern PRP4_1 having a fourth thickness T4 and a second sub photoresist pattern PRP4_2 having a fifth thickness T5 larger than the fourth thickness T4. The second photoresist pattern PRP2 is formed over the first sensing gate electrode SG1 with the fifth thickness T5.

Referring to FIG. 6B, the first and second semiconductor layer 230 and 240 are patterned using the first and second photoresist patterns PRP4 and PRP2 as etch-masks, so that the first switching semiconductor pattern WSP1, the first sensing semiconductor pattern SSP1, the second sensing semiconductor pattern SSP2 and a second semiconductor pattern 241 are formed.

The first and second photoresist patterns PRP4 and PRP2 are ashed, so that portions of the first and sub photoresist patterns PRP4_1 and PRP4_2 of the first photoresist pattern PRP4 are removed to form a third sub photoresist pattern PRP4_3 over the first switching gate electrode WG1, and so that portions of the second photoresist pattern PRP2 are removed to form a third photoresist pattern PRP3 over the first sensing gate electrode SG1.

Referring to FIG. 6C, exposed portions of the second semiconductor pattern 241 are etched, so that a second switching semiconductor pattern WSP3 including a first semiconductor portion WSP3_1 having a second thickness T2 and a second semiconductor portions WSP3_2 having a third thickness T3 larger than the second thickness T2 is formed, and the second sensing semiconductor pattern SSP2 covered by the third photoresist pattern PRP3 remains.

Figure 6D:
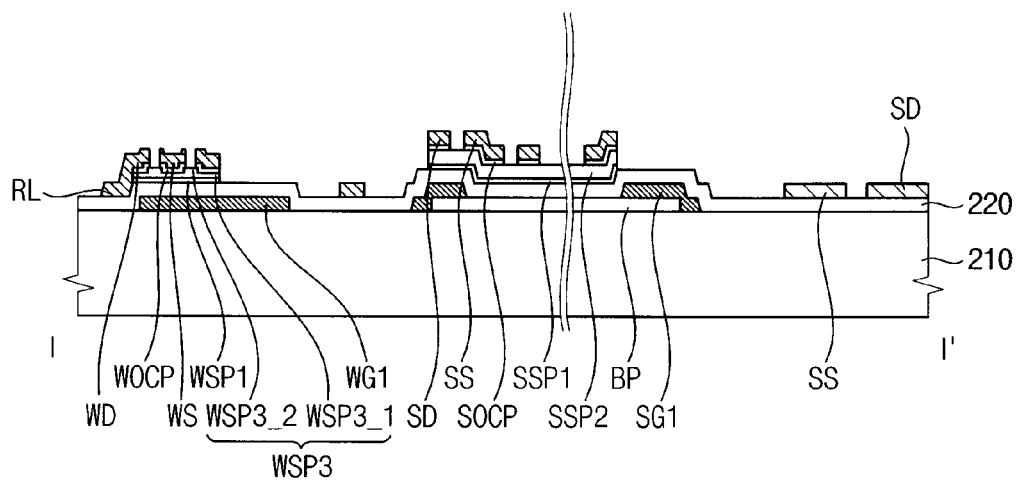

Referring to FIGS. 5A, 5B and 6D, the first semiconductor portion WSP3_1 overlaps with the switching source electrode WS and the switching drain electrode WD. The second semiconductor portion WSP3_2 overlaps with the spaces between the switching source electrode WS and the switching drain electrode WD.

According to an embodiment, the second thickness T2 of the first semiconductor portion WSP3_1 is in a range between about 500 Å and about 1500 Å. As the second thickness T2 of the first semiconductor portion WSP3_1 decreases, resistances of the first switching semiconductor pattern WSP1 and each of the switching source electrode WS and the switching drain electrode WD decrease. Thus, the mobility of the switching element WTR can increase.

Alternatively, the exposed second semiconductor pattern 241 is entirely etched, so that the first switching semiconductor pattern WSP1 is exposed. The second switching semiconductor pattern WSP3 covered by the third sub photoresist pattern PRP4_3 and the second sensing semiconductor pattern SSP2 covered by the third photoresist pattern PRP3 remains. In this case, the mobility of the switching element WTR increases, but an off current may increase.

Referring to FIG. 6D, the switching ohmic contact pattern WOCP and the sensing ohmic contact pattern SOCP are formed on the second base substrate 210 on which the first and second switching semiconductor patterns WSP1 and WSP3 and the first and second sensing semiconductor patterns SSP1 and SSP2 are formed. For example, an ohmic contact layer is formed on the second base substrate 210 on which the first and second switching semiconductor patterns WSP1 and WSP3 and the first and second sensing semiconductor patterns SSP1 and SSP2 are formed, and the ohmic contact layer is patterned, so that the switching ohmic contact pattern WOCP and the sensing ohmic contact pattern SOCP can be formed.

The switching ohmic contact pattern WOCP is formed on the second switching semiconductor pattern WSP3, and the sensing ohmic contact pattern SOCP is formed on the second sensing semiconductor pattern SSP2.

A second metal pattern is formed on the second base substrate 210 on which the switching ohmic contact pattern WOCP and the sensing ohmic contact pattern SOCP are formed. The second metal pattern includes the switching source electrode WS, the switching drain electrode WD, the sensing source electrode SS and the sensing drain electrode SD. For example, a second metal layer is formed on the second base substrate 210 including the switching ohmic contact pattern WOCP and the sensing ohmic contact pattern SOCP, and then the second metal layer is patterned, so that the second metal pattern can be formed. According to an embodiment, the second metal pattern further includes the read-out line RL.

The switching source electrode WS and the switching drain electrode WD are spaced apart from each other, and the sensing source electrode SS and the sensing drain electrode SD are spaced apart from each other. The portions of the switching ohmic contact pattern WOCP exposed by the spaces between the switching source electrode WS and the switching drain electrode WD are etched, so that the second switching semiconductor pattern WSP3 in the spaces is exposed. The sensing ohmic contact pattern SOCP exposed by the space between the sensing source electrode SS and the sensing drain electrode SD is etched, so that the second sensing semiconductor pattern SSP2 in the space is exposed.

The switching source electrode WS and the switching drain electrode WD overlap with the first semiconductor portion WSP3_1, and the spaces between the switching source electrode WS and the switching drain electrode WD overlap with the second semiconductor portion WSP3_2. The first semiconductor portion WSP3_1 disposed between the first switching semiconductor pattern and each of the switching source and drain electrodes WS and WD has the second thickness T2 substantially smaller than the third thickness T3, so that a resistance between each of the switching source and drain electrodes WS and WD and the first switching semiconductor pattern WSP1 decreases. Thus, the mobility of the switching element WTR can increase.

Alternatively, the ohmic contact layer and the second metal layer are sequentially formed on the second base substrate 210 on which the first and second switching semiconductor patterns WSP1 and WSP3 and the first and second sensing semiconductor patterns SSP1 and SSP2 are formed, and then the ohmic contact layer and the second metal layer are simultaneously patterned, so that the switching ohmic contact pattern WOCP, the sensing ohmic contact pattern SOCP and the second metal pattern can be formed.

Referring to FIG. 5A, the second and third insulating layers 250 and 260 are formed on the second base substrate 210 on which the second metal pattern is formed. The second and third insulating layer 250 and 260 formed on part of the sensing source electrode SS are removed, so that a first contact hole CNT1 is formed. In addition, the first, second and third insulating layers 220, 250 and 260 formed on part of the first sensing gate electrode SG1 are partially removed, so that a second contact hole CNT2 is formed, and the first, second and third insulating layers 220, 250 and 260 formed on part of the first switching gate electrode WG1 are partially removed, so that a third contact hole CNT3 is formed.

A third metal pattern including the second switching gate electrode WG2, the second sensing gate electrode SG2 and the bias line VL is formed on the second base substrate 210 on which the first, second and third contact holes CNT1, CNT2 and CNT3 are formed.

The blocking pattern BM, the color filter CF, the overcoating layer OC and the common electrode CE are formed on the second base substrate 210 on which the third metal pattern is formed.

According to an example embodiment, the thickness of the first semiconductor portion WSP3_1 between each of the switching source and drain electrodes WS and WD and the first switching semiconductor pattern WSP1 is smaller than the thickness of the second semiconductor portion WSP3_2 in the spaces between the switching source electrode WS and the switching drain electrode WD, so that the mobility of the switching element WTR increases.

According to embodiments of the present invention, first and second switching semiconductor patterns of a switching element and first and second sensing semiconductor patterns of a sensing element are simultaneously formed using a mask, so that a manufacturing cost can be reduced.

In addition, a thickness of a second switching semiconductor pattern of the switching element is smaller than a thickness of a second sensing semiconductor pattern of the sensing element, so that the mobility of the switching element can be improved.

In addition, a thickness of each of first semiconductor portions between each of a switching source and drain electrodes and a first switching semiconductor pattern is smaller than a thickness of a second semiconductor portion in a space between the source electrode and the drain electrode, so that the mobility of the switching element can be improved.

The foregoing is illustrative of embodiments of the present invention and is not to be construed as limiting thereof. Although a few example embodiments of the present invention have been described, those skilled in the art will readily appreciate that many modifications are possible. Accordingly, all such modifications are intended to be included within the scope of the embodiments of the present invention as defined in the claims.

What is claimed is:

1. A touch substrate comprising:
   a base substrate;
   a sensing element disposed on the base substrate, including a sensing semiconductor pattern, and configured to sense infrared light, wherein the sensing semiconductor pattern comprises a first sensing semiconductor pattern, and a second sensing semiconductor pattern disposed on the first sensing semiconductor pattern; and
   a switching element electrically connected to the sensing element, including a same material as a material of the sensing semiconductor pattern, and including a switching semiconductor pattern having a thickness different from a thickness of the sensing semiconductor pattern,
   wherein the switching semiconductor pattern comprises a first switching semiconductor including a same material as a material of the first sensing semiconductor pattern, and a second switching semiconductor pattern including a same material as a material of the second sensing semiconductor pattern, and disposed on the first switching semiconductor pattern.

2. The touch substrate of claim 1, wherein the first sensing semiconductor pattern includes amorphous silicon (a-Si), and a second sensing semiconductor pattern includes amorphous silicon germanium (a-SiGe).

3. The touch substrate of claim 1, wherein the second sensing semiconductor pattern has a first thickness, and the second switching semiconductor pattern has a second thickness smaller than the first thickness.

4. The touch substrate of claim 3, wherein the first thickness is substantially the same as or more than about 4000 Å, and the second thickness is in a range between about 500 Å and about 1500 Å.

5. The touch substrate of claim 1, wherein the second switching semiconductor pattern includes a first semiconductor portion having a first thickness and a second semiconductor portion having a second thickness smaller than the first thickness.

6. The touch substrate of claim 5, wherein the switching element further comprises:
   a switching gate electrode overlapping with the first and second switching semiconductor patterns; and
   a switching source electrode and a switching drain electrode spaced apart from each other, and disposed over the first and second switching semiconductor patterns, and wherein
   the first semiconductor portion overlaps with a space between the switching source electrode and the switching drain electrode, and
   the second semiconductor portion overlap's with the switching source electrode and the switching drain electrode.

7. The touch substrate of claim 6, wherein the switching element further comprises a switching ohmic contact pattern disposed between the second switching semiconductor pattern and each of the switching source and drain electrodes.

8. The touch substrate of claim 1, wherein the sensing element further comprises:
   a sensing gate electrode overlapping with the first and second sensing semiconductor patterns; and
   a sensing source electrode and a sensing drain electrode spaced apart from each other, and disposed over the first and second sensing semiconductor patterns.

* * * * *